United States Patent [19]

Higashisaka

[11] Patent Number: 5,030,852
[45] Date of Patent: Jul. 9, 1991

[54] QUASICOMPLEMENTARY MESFET LOGIC CIRCUIT WITH INCREASED NOISE IMUNITY

[75] Inventor: Norio Higashisaka, Hyogo, Japan

[73] Assignee: Mitsubishi Denki Kabushiki Kaisha, Tokyo, Japan

[21] Appl. No.: 517,626

[22] Filed: May 1, 1990

[30] Foreign Application Priority Data

May 8, 1989 [JP] Japan .................................... 1-114528
Apr. 18, 1990 [JP] Japan .................................... 2-104307

[51] Int. Cl.$^5$ .......................................... H03K 19/017
[52] U.S. Cl. .................................... 307/448; 307/443; 307/475
[58] Field of Search ................. 307/448, 450, 443, 475

[56] References Cited

U.S. PATENT DOCUMENTS

| 4,712,022 | 12/1987 | Vu | 307/448 |
| 4,831,284 | 5/1989 | Anderson et al. | 307/475 |
| 4,931,670 | 6/1990 | Ting | 307/448 |
| 4,967,102 | 10/1990 | Mahler | 307/443 |

FOREIGN PATENT DOCUMENTS 0217721  9/1987  Japan ..................... 307/448

OTHER PUBLICATIONS

Silicon MESFET Digital Circuit Techniques, Hartring, Rosario, Pickett, IEE Journal of Solid State Circuits, vol. SC-16, No. 5, Oct. 1981.
"Simulation of Load-Current-Controlled GaAs Logic Circuits", by Norio Akamatsu, Collected Paters of Electronic Information Communication Meeting, 87/2, vol. J70-D No. 2, pp. 290-297.

Primary Examiner—David Hudspeth
Assistant Examiner—Scott A. Ouellette
Attorney, Agent, or Firm—Lowe, Price, LeBlanc and Becker

[57] ABSTRACT

Disclosed is a logic circuit performing a quasi-complementary operation. This logic circuit includes a load transistor having a drain connected to a first power supply, a drive transistor having a source connected to a second power supply, a level shift diode connected between a source of the load transistor and a drain of the drive transistor, a resistor connected between a gate of the load transistor and the first power supply, an input portion for applying a signal for complementarily turning on the load transistor and drive transistor in response to an input signal, and a resistor connected between a gate of the drive transistor and the second power supply. Therefore, a gate potential of the load transistor is set to a potential which is always higher than a drain voltage, so as to prevent an output high level from being lowered and expand a logic voltage swing. Further, there is disclosed a logic circuit in which a plurality of quasi-complementary logic circuits are coupled by a wired logic. This circuit configuration enables the number of gate stages to be reduced in case where the plurality of logic circuits are coupled.

14 Claims, 8 Drawing Sheets

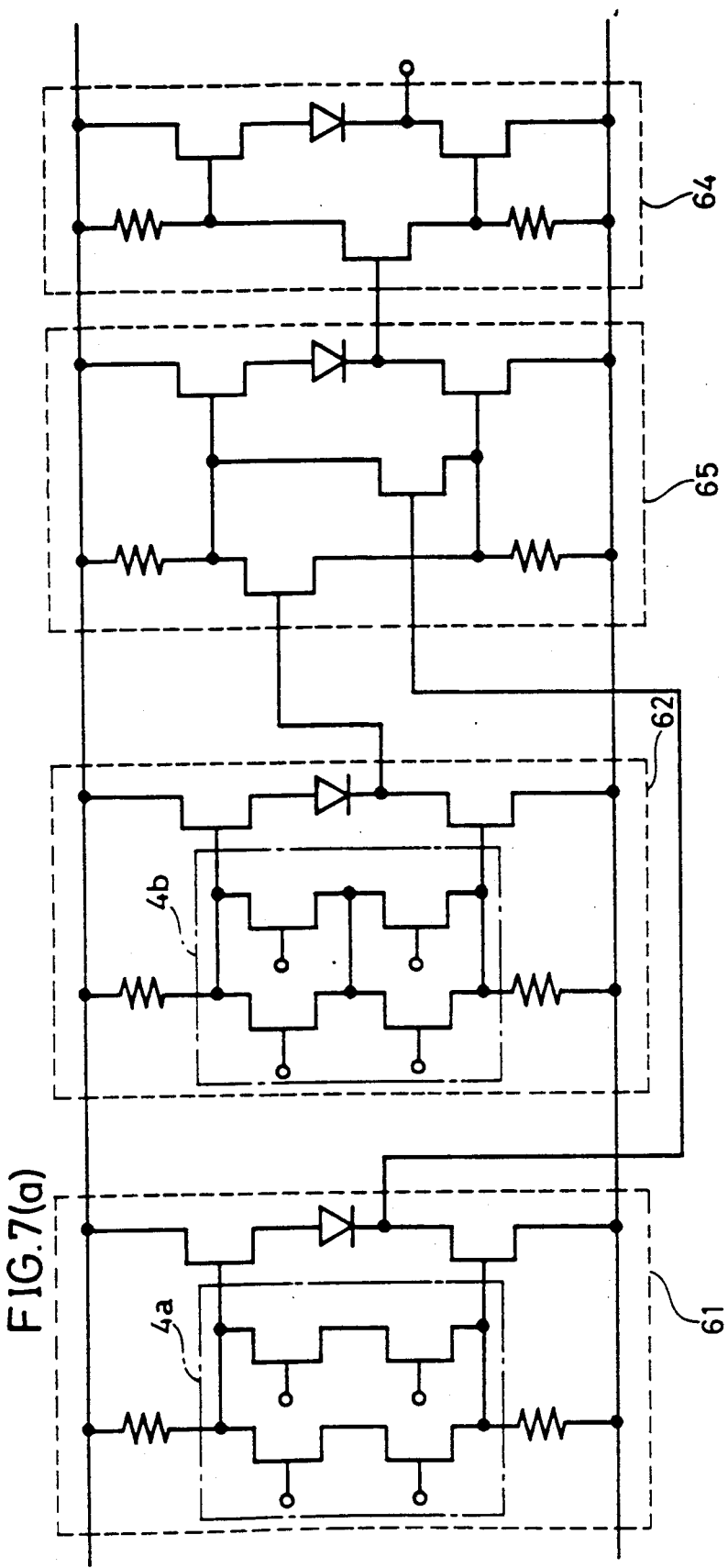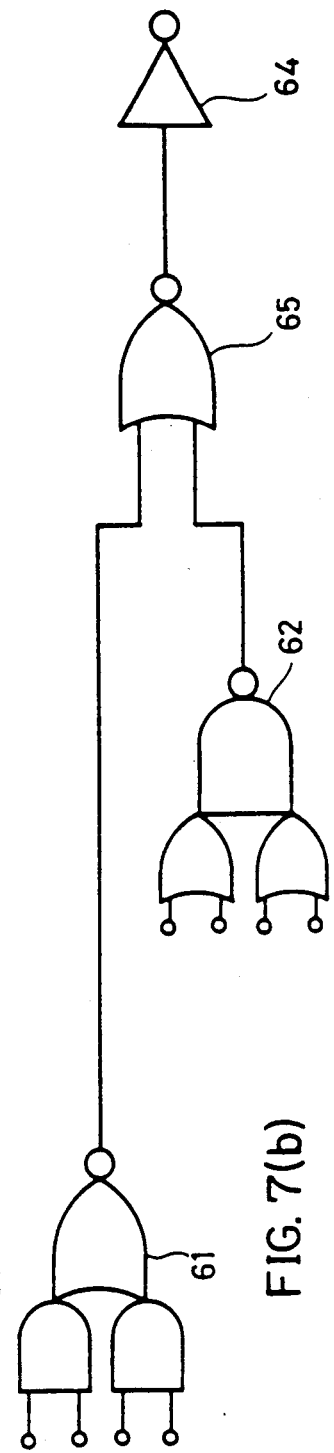
FIG.7(a)
FIG.7(b)

QUASICOMPLEMENTARY MESFET LOGIC CIRCUIT WITH INCREASED NOISE IMUNITY

BACKGROUND OF THE INVENTION

1. Field of the Invention

The present invention relates generally to logic circuits, and more particularly to logic circuits formed on the same substrate for carrying out a quasi-complementary operation.

2. Description of the Background Art

In recent years, there have been increasing demands for semiconductor integrated logic circuits operable at very high speed with increased noise margin and capable of being highly integrated with lower power consumptions. To satisfy such increasing demands, electronic devices employing a III-V group compound semiconductor such as GaAs in place of conventionally employed silicon are energetically studied and developed.

The following transistor types emaloy GaAs construction: MESFET (Metal Semiconductor Junction FET), HEMT (High Electron Mobility Transistor), HBT (Hetero Junction Bipolar Transistor), RHET (Resonant Hot Electron Transistor), etc. The HEMT, HBT and RHET require advanced process techniques such as epitaxial growth by, e.g., MBE (Molecular Beam Epitaxy), Mo-CVD (Metal organic Chemical Vapor Deposition) etc., Transistor fabrication using these advanced processes are currently under development and are not yet available on a commercial basis. Concerning As for MESFET devices, however, a 16KSRAM and a 30KG gate array and the like have already been presented in a meeting concerned in the field, and products of LSI level are about to be put in practice.

As logic circuits employing GaAs MESFET, various circuit configurations are used such as DCFL (Direct Coupled FET Logic), BFL (Buffered FET Logic), SCFL (Source Coupled FET Logic), LPFL (Low Pinchoff voltage FET Logic) and SDFL (Schottky Diode FET Logic).

An example of the DCFL circuit will now be described with reference to FIG. 10. This circuit comprises DCFL inverter circuits 19a and 19b connected at two stages, each of which includes a load transistor 10 formed of a depletion type MESFET having a drain connected to a first power supply $V_{DD}$ and a source and a gate connected to each other, and a drive transistor 20 formed of an enhancement type MESFET having a drain connected to a common node of the source and gate of load transistor 10, a source connected to a second power supply GND and a gate provided with an input. At both stages, an output can be derived from the common node of the source and gate of each of load transistors 10.

Since the DCFL has a simple configuration with a small number of elements and operates at the highest speed out of the circuits currently being proposed, it is applied to many logic LSIs as well as memories. The DCFL, however, has a disadvantage that an output high level $V_{OH}$ is limited to approximately 0.6 V or less of a clamping voltage of a transistor at the succeeding stage. That is, in the MESFET employed in DCFL, since its gate and channel have a Schottky junction which is different from a MOS transistor made of silicon or the like, a current abruptly starts flowing from the gate to source when a source-gate voltage exceeds a clamping voltage which is determined by a gate metal and an impurity concentration. Therefore, the gate-source voltage in the MESFET can not increase beyond the clamping voltage. Thus, an output level of DCFL circuit 19a at the first stage in the circuit of FIG. 10 is limited by the clamping voltage across the source and gate of drive transistor 20 in DCFL circuit 19b at the second stage. Since the clamping voltage across the gate and source of the MESFET is normally at approximately 0.6 V, the output high level VOH is limited to 0.6 V or less. Meanwhile, since an output low level $V_{OL}$ is approximately 0.1 V, a logic voltage swing $V_L$ becomes approximately 0.5 V.

An ECL circuit employing a silicon bipolar transistor operates with a logic voltage swing $V_L$ being approximately 0.5 V. This is possible because a logic level is determined by employing a highly controllable base-emitter voltage $V_{BE}$ and a resistance ratio. In the DCFL employing MESFET, a logic level is affected by a gate threshold voltage $V_{th}$ and a variable parameter such as a current characteristic, and hence it is very difficult to manufacture large-scale integrated circuits in mass production while retaining a sufficient noise margin at approximately 0.5 V of logic voltage swing $V_L$. Furthermore, although power consumption of DCFL is comparatively low at 0.1 mW–1.0 mW, it is desirable on an LSI basis to further decrease the power consumption with regard to allowable power consumption of chip.

Under such circumstances, a GaAs load current controlled logic circuit (hereinafter referred to as LCCL) is proposed (e.g., in Collected Papers of Electronic Information Communication Meeting 87/2 Vol. J70-D No. 2). FIG. 11 shows an inverter circuit as an example of the LCCL. The LCCL of FIG. 11 comprises a depletion type load transistor 1 having a drain connected to a first power supply $V_{DD}$, a drive transistor 2 having a drain connected to a source of load transistor 1, a source connected to a second power supply GND and a gate connected to an input terminal IN. A resistor 3 is connected between a node of the source of load transistor 1 and the drain of drive transistor 2 and a gate of load transistor 1. Load transistor controlling transistor 4 has a drain connected to a node of the gate of load transistor 1 and resistor 3, a source connected to a third power supply $V_{SS}$ which has a lower voltage than the second power supply GND and a gate connected to the input terminal IN.

This LCCL operates in the following manner. When the input IN is at low level, drive transistor 2 and control transistor 4 are both in OFF state, so that no current flows through resistor 3 and thus a drop voltage in resistor 3 is 0V. Accordingly, a gate-source voltage $V_{GS}$ in load transistor 1 is 0V at this time. Referring to FIG. 12, output level an $V_{out}$ becomes a voltage $V_{OH}$ at an intersection 21 of a load curve ($V_{GS}$=0V) shown by the solid line a. An input characteristic of a logic circuit at the succeeding stage (Schottky characteristic of an input transistor, or in detail, Schottky voltage of control transistor 4) is shown by solid line b.

When the input IN is at a high level, drive transistor 2 and control transistor 4 are both in an ON state, so that a current flows through resistor 3 to cause a potential difference between opposite ends thereof. Therefore, the gate-source voltage $V_{GS}$ of load transistor 1 attains a negative value, so that load transistor 1 attains a near OFF state as shown by the dotted line d of FIG. 12. Thus, the output level $V_{out}$ at this time becomes a voltage $V_{OL1}$ at an intersection 22 of a current characteristic of drive transistor 2 shown by the dotted line c and that of load transistor 1 shown by the dotted line d of FIG. 12. It should be noted, however, that load transistor 1 is not completely turned off since a current flows through resistor 3 in this case.

As described in the foregoing, controlling load transistor 1 according to an input level causes the LCCL to perform such a quasi-complementary operation as follows: when the input is at high level, load transistor 1 is almost turned off, while when the input is at low level, drive transistor 2 is completely turned off.

Since the LCCL performs the above described quasi-complementary operation so as to cause little load currents to flow when the input is at high level or low level, it is possible to decrease the power consumption to about a half when compared to the DCFL of FIG. 12.

Further, the DCFL employing GaAs has a disadvantage in that a fluctuation in the characteristic of elements causes frequent eroneous operations; however, in the LCCL, this problem is reduced by the quasi-complementary operation by which a load current is small when the input is at high level.

This point will be described in further detail in the following. An output low level of DCFL is indicated by a voltage $V_{a2}$ at an intersection 23 of an $I_{ds}$–$V_{DS}$ characteristic of the drive transistor shown by the dotted line c and that of the load transistor when $V_{DS}=0V$ shown by the solid line a, in FIG. 12. Meanwhile, an output low level of LCCL is indicated by a voltage $V_{OL}$ at an intersection 22 of the dotted line c and the dotted line d showing the $I_{ds}$–$V_{DS}$ characteristic of the load transistor when $V_{GS}$ is negative biased. Here, a drain-source current $I_{ds}$ is approximated as follows:

$$I_{ds} = \beta(V_{GS} - V_{th})^2 \quad \ldots (1)$$

where $V_{GS}$ is a gate-source voltage, and $V_{th}$ is a gate threshold voltage.

Assuming that the fluctuation of Vth is $\Delta V_{th}$ where $V_{th} > 0$, a saturation current $I_{ds}$ (a) of the characteristic shown by the solid line a is expressed as below:

$$I_{ds}(a) = \beta(-V_{th})^2 \quad \ldots (2)$$

As $V_{th} < 0$, a fluctuation width $\Delta I_{ds}(a)$ of $I_{ds}(a)$ is expressed as follows:

$$\Delta I_{ds}(a) = \beta(-V_{th} + \Delta V_{th})^2 - \beta(-V_{th} - \Delta V_{th})^2$$
$$= -4\beta V_{th}\Delta V_{th} \ldots (3)$$

Similarly, a saturation current $I_{ds}(d)$, $\Delta I_{ds}(d)$ with respect to the characteristic shown by the dotted line d is shown below:

$$I_{ds}(d) = \beta(V_{GS} - V_{th})^2 \quad \ldots (4)$$
$$\Delta I_{ds}(d) = \beta(V_{GS} - V_{th} + \Delta V_{th})^2 - \beta(V_{GS} - V_{th} - \Delta V_{th})^2 = 4\beta(V_{GS} - V_{th})\Delta V_{th} \ldots (5)$$

Further, when a non-saturated portion of the characteristic of the dotted line c is approximated to a straight line, a fluctuation ratio $$\frac{\Delta V_{OL}}{\Delta V_{OL'}}$$

of the output low level of LCCL to that of DCFL is expressed as follows:

$$\frac{\Delta V_{OL}}{\Delta V_{OL'}} = \frac{\Delta I_{ds}(d)}{\Delta I_{ds}(a)} = \frac{V_{th} - V_{GS}}{V_{th}} < 1 \quad (6)$$

The fluctuation of the output low level of LCCL becomes smaller than that of DCFL. Where $V_{th}=0.4$ V, VGS (LCCL)$=-0.3$ V, the fluctuation ratio is shown as follows:

$$\frac{\Delta V_{OL}}{\Delta V_{OL'}} = \frac{1}{4} \quad (7)$$

As shown above, the fluctuation of low level of LCCL becomes ¼ that of DCFL. In addition to lower power consumption in comparison with DCFL circuits as described above, LCCL circuits exhibit decreased fluctuation of its low level output.

The LCCL has another characteristic in that the fluctuation Of low level of LCCL is smaller than that of DCFL. The advantage of LCCL is due to the quasi-complementary operation in which little load currents flow when the output is at low level, and hence it is considered that the quasi-complementary operation circuit is effective for enhancing the performance of the GaAs logic circuit. The LCCL, however, has the following disadvantages.

In the conventional logic circuit, as described above, the source of the control transistor is terminated by the third power suppl $V_{SS}$ which has a lower potential than that of the second power supply level, i.e., lower than GND potential. Therefore, the input high level is clamped with a voltage which is lower than that in case of an DCFL circuit. The reason why the source of control transistor 4 is terminated by $V_{SS}$ having a lower potential than GND is that when the input is at high level, the drain of control transistor 4 has a lower potential than the drain of drive transistor 2 due to a voltage drop in resistor 3. However, a current is also required to flow through control transistor 4 at this time. Even if a depletion type transistor is employed as control transistor 4, the source of control transistor 4 must not be connected to GND since $V_{DS}$ must be greater than zero. Thus, it is impossible to avoid the decrease in $V_{OH}$ due to the termination of the source of control transistor 4 by $V_{SS}$.

In addition, since the gate of drive transistor 2 and that of control transistor 4 are connected in parallel, a load capacitance is increased with respect to a logic output at the preceding stage, thereby preventing fast circuit switching operation. Moreover, while FIG. 11 shows the inverter circuit, as the number of inputs is increased such as 2 NOR, for example, the number of control transistors 4 and drive transistors 2 must also be increased, resulting in a degradation in degrees of integration.

SUMMARY OF THE INVENTION

It is an object of the present invention to expand a logic voltage swing in a logic circuit.

It is another object of the present invention to reduce an input load capacitance and alleviate a degradation in degrees of integration in case of multi-input logic, in a quasi-complementary logic circuit.

It is a further object of the present invention to reduce the number of gate stages and achieve a faster operation, lower power consumption and higher degrees of integration by introducing wired logic into multi-input logic, in a quasi-complementary logic circuit.

Briefly, a logic circuit in accordance with the present invention is directed to a logic circuit performing a quasi-complementary operation including a load transistor having a drain connected to a first power supply and a drive transistor having a source connected to a second power supply. Level shifting means is connected between a source of the load transistor and a drain of the drive transistor. A first resistor is connected between a gate of the load transistor and the first power supply. Input means responsive to a signal at an input terminal signal for turning on/off complementarily the load transistor and the drive transistor to the gate of the load transistor and to the gate of the drive transistor. An output signal is supplied at the drain of the drive transistor, and a second resistor is connected between the gate of the drive transistor and the second power supply.

In operation, in the quasi-complementary logic circuit in accordance with the present invention, the input means complementarily turns the load transistor and drive transistor on and off in response to an input signal. With the load transistor turned on and the drive transistor turned off, a voltage level of the first power supply is shifted by the load transistor and level shift means and then clamped (i) by input means at the succeeding stage connected to the output portion and (ii) by a Schottky potential of the drive transistor. Conversely, with the load transistor turned off and the drive transistor turned on, a voltage at the output portion is lowered close to the potential of the second power supply, i.e., ground potential. That is, since an output high level of logic voltage swing is determined by the input means at the succeeding stage and Schottky voltage of the drive transistor, the logic voltage swing is expanded. In addition, since the resistor means for controlling the load transistor is connected between the gate of the load transistor and the first power supply, a portion connecting the gate of the load transistor and the logical input means does not have a potential which is than lower that of the drain of the drive transistor. Therefore, a third power supply $V_{SS}$ is no longer required, and the output high level is not lowered. Moreover, since the input terminal is connected only with the input means and not directly with the drive transistor, an input load capacitance can be decreased, thereby alleviating the degradation in degrees of integration in case of multi-input logic.

As mentioned above, the logic circuit in accordance with the present invention makes it possible to expand the logic voltage swing and enlarge a noise margin thereby to perform a stable logic operation. Therefore, manufacturing such a circuit is simplified, thereby enabling large-scale integration of a GaAs logic circuit. Further, it is possible to achieve higher degrees of integration and lower power consumption resulting from the following points: faster circuit operation is possible due to the reduction of input capacitance; the logic circuit can be formed with a minimally increased number of elements even in multi-input logic; and a logical function per gate can be made complex.

The logic circuit in accordance with the present invention further includes a resistor connected to the first power supply and voltage clamping means connected in parallel with the resistor. A load transistor has a gate connected to the resistor means and a drain connected to the first power supply. A level shifter has one end connected to a source of the load transistor and the other end used as an output terminal. A plurality of drive transistors having respective drains connected in common to the output terminal and sources connected to the second power supply. A plurality of input logic portions each include input inversion portions connected in common to the gate of the load transistor for outputting complementary signals and input non-inversion portions connected to the respective gates of the drive transistors. In operation, in the logic circuit in accordance with the present invention, a logical product (AND) of the input inversion portions is provided to the gate of the load transistor, and a logical sum (OR) of the input non-inversion portions is produced by the drive transistors, and hence the AND can be obtained from outputs thereof.

In addition, the logic circuit of the present invention includes a plurality of load transistors having their drains connected to the first power supply and their sources connected in common, level shifting means having one end connected to the common connecting portion of the sources and the other end used as an output terminal. A plurality of drive are connected in series between the output terminal and the second power supply, and a plurality of input logic portions have (i) input inversion portions connected to respective gates of the load transistors and (ii) input non-inversion portions connected to respective gates of the drive transistors.

In operation, the OR of the input inversion portions is produced by the load transistors, and the AND of the input non-inversion portions is produced by the drive transistors, and hence OR can be obtained from outputs thereof.

As has been described, the logic circuit in accordance with the present invention makes it possible to introduce wired logic into a QCL (Quasi-Complementary Logic Circuit) and thus reduce the number of gate stages, resulting in faster operation, lower power consumption and a higher degree of integration of the integrated circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 (b) is an equivalent circuit diagram of the logic circuit of FIG. 4 (a);

FIG. 5 (b) is an equivalent circuit diagram of the logic circuit of FIG. 5 (a);

FIG. 6 (b) is an equivalent circuit diagram of the logic circuit of FIG. 6 (a);

FIG. 7 (a) is a circuit diagram showing a logic circuit according to a sixth embodiment of the present invention;

FIG. 7 (b) is an equivalent circuit diagram of the logic circuit of FIG. 7 (a);

DESCRIPTION OF THE PREFERRED EMBODIMENTS

Figure 1:
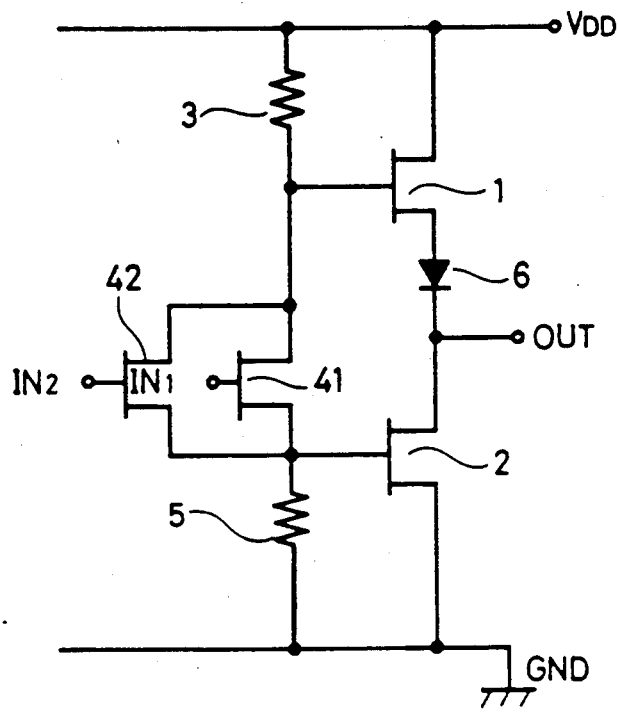
FIG. 1 is a circuit diagram showing a logic circuit according to a first embodiment of the present invention.

FIG. 1 is an embodiment in which the logic circuit of the present invention is applied to a two-input NOR circuit. Referring to FIG. 1, the logic circuit comprises a load transistor 1 employing an enhancement type transistor having its drain connected to a first power supply $V_{DD}$. A drive transistor 2 has its source connected to a second power supply represented by GND. Level shift diode 6 has its anode connected to a source of load transistor 1 and its cathode connected to a drain of drive transistor 2. A load transistor controlling resistor 3 is connected between a gate of load transistor 1 and the first power supply $V_{DD}$, and a load transistor controlling transistors 41 and 42 having their drains connected to the control resistor 3, their sources connected to the second power supply GND through a resistor 5 and their gates connected to input terminals IN1 and IN2, respectively. The input terminals IN1 and IN2 and load transistors 41 and 42 together constitute an input terminal. A logic output signal OUT is supplied at a node of the cathode of level shift diode 6 and the drain of drive transistor 2.

Figure 3:
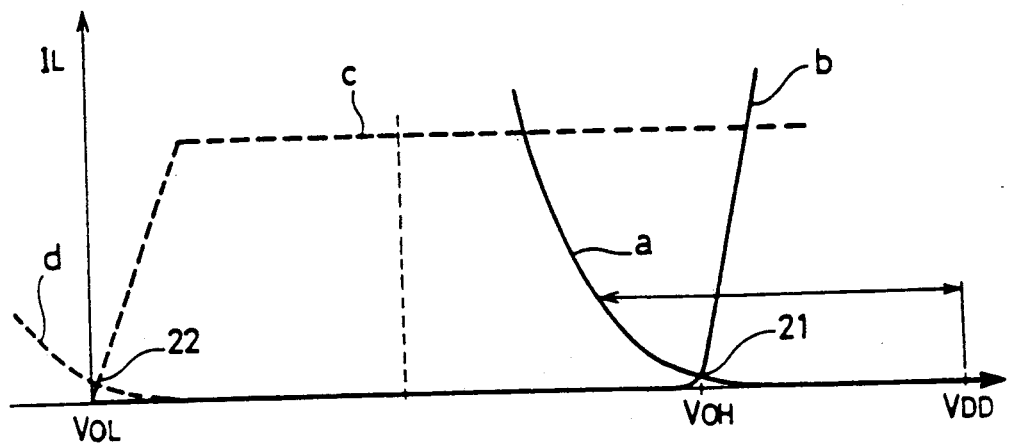
FIG. 3 is a diagram showing an operation characteristic of the logic circuit of the present invention.
Figure 12:
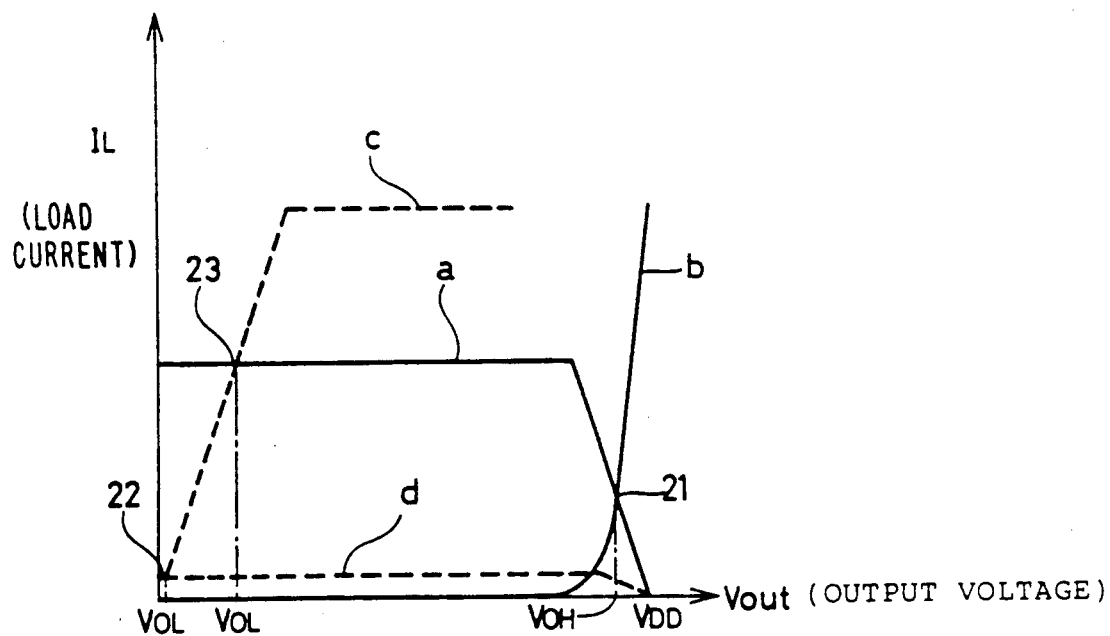
FIG. 12 is a diagram showing an operation characteristic of the conventional logic circuits.

The operation of the circuit of FIG. 1 will now be described. When a low level signal is supplied to both the input terminals IN1 and IN2, drive transistor 2 and control transistors 41 and 42 are all cut off, so that no current flows through control resistor 3, thereby producing no potential difference between opposite ends of control resistor 3. Thus, the gate of load transistor 1 has a potential raised to an approximately $V_{DD}$ potential. This causes an output voltage $V_{OUT}$ and a load current IL flowing through load transistor 1 to be level-shifted by level shift diode 6 and a gate threshold voltage $V_{th}$ of load transistor 1. An output signal supplied at terminal OUT indicates a current-voltage characteristic shown by the solid line a of FIG. 3. An intersection 21 of the characteristic shown by the solid line a and that of an input transistor at the succeeding stage shown by the solid line b becomes an operation point when an input is at low level, and an output voltage at this time attains an output high level ($V_{OH}$). Since control resistor 3 connected between the drain and gate of the load transistor (in case of LCCL) is connected between the first power supply $V_{DD}$ and the gate of load transistor 1 in the present invention, the respective drains of the load transistors do not have a lower potential than that of the drain of load transistor 1. Thus, there is no need to terminate the respective sources of control transistors 41 and 42 by a potential $V_{SS}$ lower than GND. Accordingly, the output high level $V_{OH}$ is not lowered. Furthermore, since two Schottky junctions caused by each of control transistors 41 and 42 and load transistor 2 exist between each of the input terminals IN1 and IN2 and the second power supply GND, a clamping voltage of the characteristic shown by the solid line b is doubled compared to that of the conventional example. Therefore, the voltage $V_{OH}$, as shown in FIG. 3, is approximately twice that of the conventional circuit shown in FIG. 12.

When a high level signal is supplied to at least one of input terminals IN1 and IN2, at least one of control transistors 41 and 42 and drive transistor 2 are turned on, so as to produce a voltage drop at the opposite ends of control resistor 3. This decreases a gate-source voltage $V_{GS}$ in load transistor 1 turning off load transistor 1. A resultant current-voltage characteristic of the output OUT is represented by the dotted line d of FIG. 3, and an intersection 22 of the characteristic shown by the dotted line d and that of drive transistor 2 shown by the dotted line c becomes an operation point when an input is at high level. As shown by line C, drive transistor 2 is substantially, but not fully off when a high signal level is applied at the input. A voltage existing at this time attains an output low level ($V_{OL}$). At least one of control transistors 41 and 42 is turned on, so that a current flows through control resistor 3; however, this current can be set low (at approximately several tens micro ampere) since control transistors 41 and 42 merely perform level shifting for drive transistor 2 and gate controlling for load transistor 1.

Figure 11:
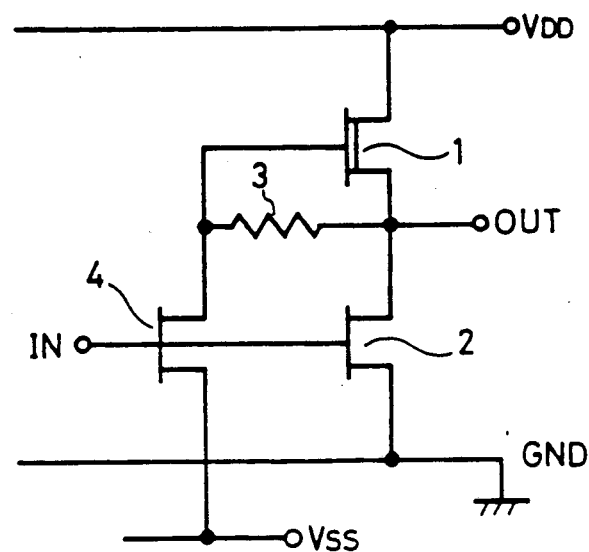

As described above, in this embodiment, although a small current flow is required to through either control transistor 41 or 42 in the event of output low level, it is possible to eliminate the decrease of voltage of output high level $V_{OH}$, which is a problem for the conventional circuit. According to the invention, this is accomplished without degrading the operating characteristics of quasi-complementary operation of the conventional circuit. Further, the output high level $V_{OH}$ is approximately double that of the conventional circuit, so that the logic voltage swing is expanded. That is, the source of input transistor 4 in the conventional circuit of FIG. 11 is connected to the $V_{SS}$ level lower than the GND level, so that $V_{OH}$ is lower than in DCFL. However, in the embodiment of FIG. 1, an input characteristic is clamped by Schottky junction across the gate and source of drive transistor 2, along with Schottky junctions across the respective gates and sources of control transistors 41 and 42. This structure results in a clamping voltage approximately double that of the conventional circuit can be obtained. The output high level $V_{OH}$ thus becomes double that of DCFL. Furthermore, in the embodiment of FIG. 1, since the operating characteristic of quasi-complementary operation of the conventional circuit are unchanged, the output low level $V_{OL}$ is lower than that of DCFL, similarly to the conventional circuit. This causes the logic voltage swing to be twice that of the conventional circuit to retain a sufficient noise margin for practical use.

According to this embodiment, it is possible to reduce an input capacitance and increase logic operation speed compared to the conventional circuit. In the conventional LCCL, the respective gates of the drive transistor and control transistor are connected in common to the input terminal. In contrast in this embodiment, only control transistors 41 and 42 are connected to input terminals IN1 and IN2, and the gate of drive transistor 2 is connected to resistor 5 connected between the respective sources of control transistors 41 and 42 and GND. This structure of the invention reduced an input capacitance. In further, since control transistors 41 and 42 can be made smaller than drive transistor 2, the input capacitance is reduced to be a half or less compared to that of LCCL. This causes reduced intrinsic delay time and lower dependency of fan out (a ratio of a drive current of an output to an input current), so as to achieve a faster logic operation.

Further, in the conventional LCCL, the number of control transistors and drive transistors must be increased in forming a multi-input circuit such as a two-input NOR circuit. In this embodiment, only the number of control transistors 41 and 42 need be increased. The structure is also applicable to multi-input circuits wherein integration density can be increased with a minimal increase in the number of elements.

Figure 2:
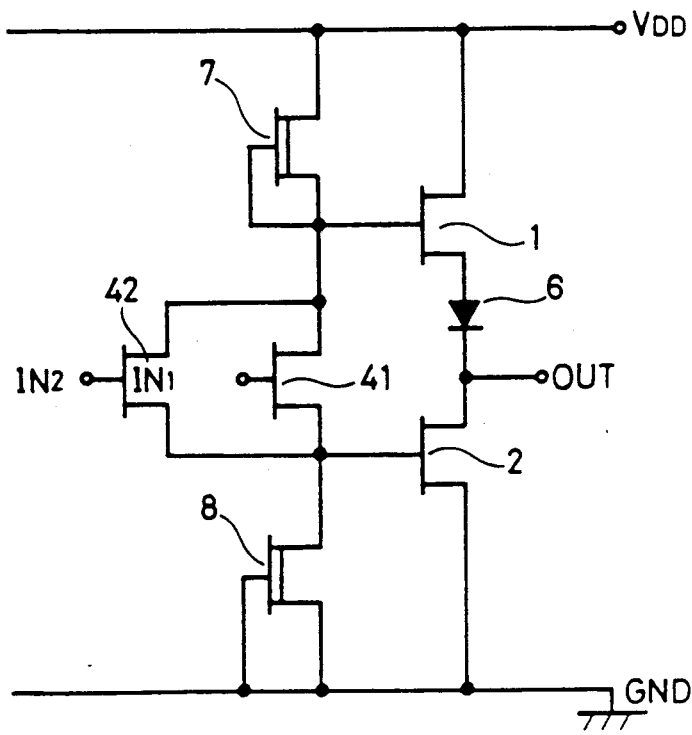
FIG. 2 is a circuit diagram showing a logic circuit according to a second embodiment of the present invention.

FIG. 2 shows a logic circuit according to the second embodiment of the present invention, in which load transistor controlling resistor 3 and drive transistor controlling resistor 5 in the logic circuit shown in FIG. 1 are replaced by load transistor controlling constant current transistor 7 and drive transistor controlling transistor 8, respectively. Depletion type transistors are employed for transistors 7 and 8. Although the operation and action of the logic circuit of FIG. 2 are the same as those of the logic circuit of FIG. 1, the logic circuit of FIG. 2 requires less circuit area by employing depletion type transistors 7 and 8 in place of resistors.

Figure 4A:
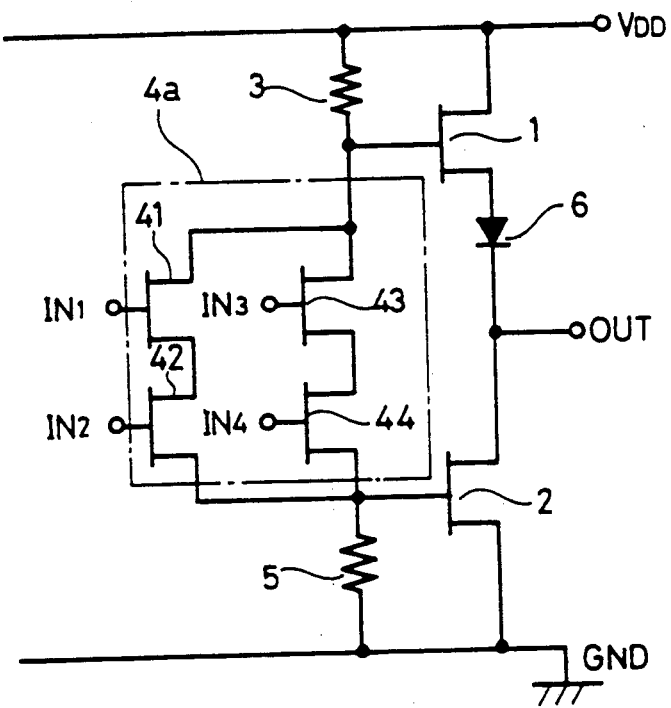
FIG. 4 (a) is a circuit diagram showing a logic circuit according to a third embodiment of the present invention.
Figure 4B:
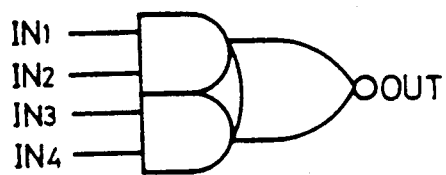

FIG. 4 (a) shows a logic circuit according to the third embodiment of the present invention. In the third embodiment, control transistors 41 and 42 in the logic circuit of FIG. 1 are replaced by four control transistors 41, 42, 43 and 44.

As shown in FIG. 4 (a), control transistors 41 and 43 have respective drains connected to the gate of load transistor 1 and respective sources connected to drains of control transistors 42 and 44, respectively. Control transistors 42 and 44 have their sources connected in common to the gate of drive transistor 2. Those four control transistors 41, 42, 43 and 44 together constitute an input portion 4a. The gates of the control transistors are employed as input terminals IN1, IN2, IN3 and IN4, respectively.

The logic circuit of FIG. 4 (a) constitutes an AND/NOR logic in which two two-input AND gates are NOR-connected, as shown in FIG. 4 (b).

Figure 5A:
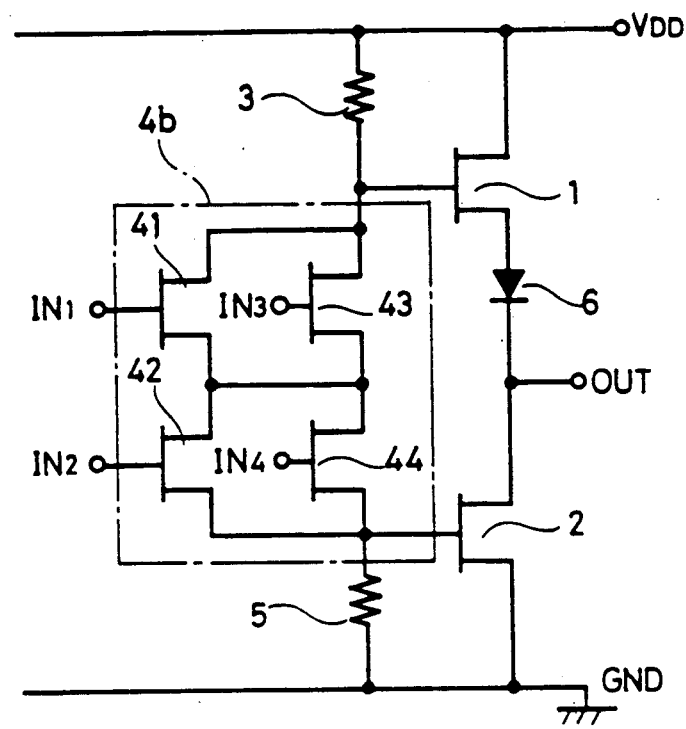
FIG. 5 (a) is a circuit diagram showing a logic circuit according to a fourth embodiment of the present invention.
Figure 5B:
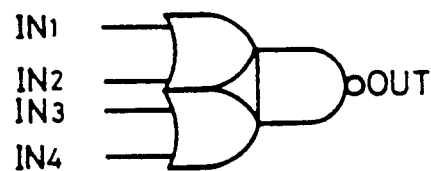
Figure 10:
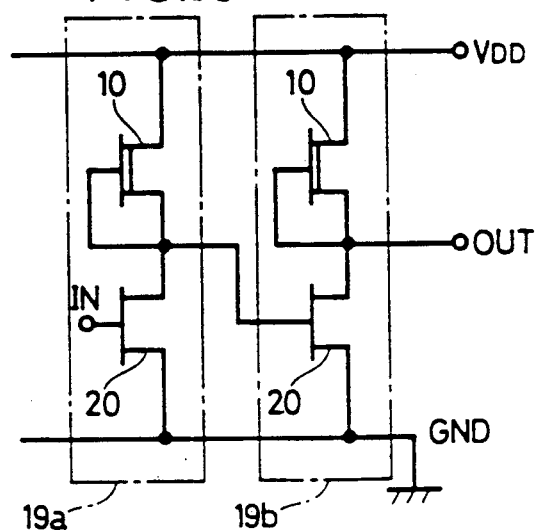
FIGS. 10 and 11 are circuit diagrams showing conventional logic circuit examples.

FIG. 5 (a) shows a logic circuit according to a fourth embodiment of the present invention. In this embodiment, control transistors 41 and 43 have respective sources connected in common and control transistors 42 and 44 having their drains connected in common to the sources of control transistors 41 and 43 connected in common. These four control transistors 41, 42, 43 and 44 together constitute a input portion 4b similarly to the embodiment of FIG. 4 (a). The gates of the control transistors are employed as input terminals IN1, IN2, IN3 and IN4, respectively.

The logic circuit of FIG. 5 (a) constitutes an OR/NAND logic in which two two-input OR gates are NAND-connected, as shown in FIG. 5 (b).

The logic circuits of FIGS. 4 and 5 can achieve a faster logic operation compared to the conventional circuit and increase a logic function per gate, resulting in higher degrees of integration or reduced power consumption.

Other complex logic circuit may be formed by application of the above described logic circuit as follows.

Figures 6A, 6B:
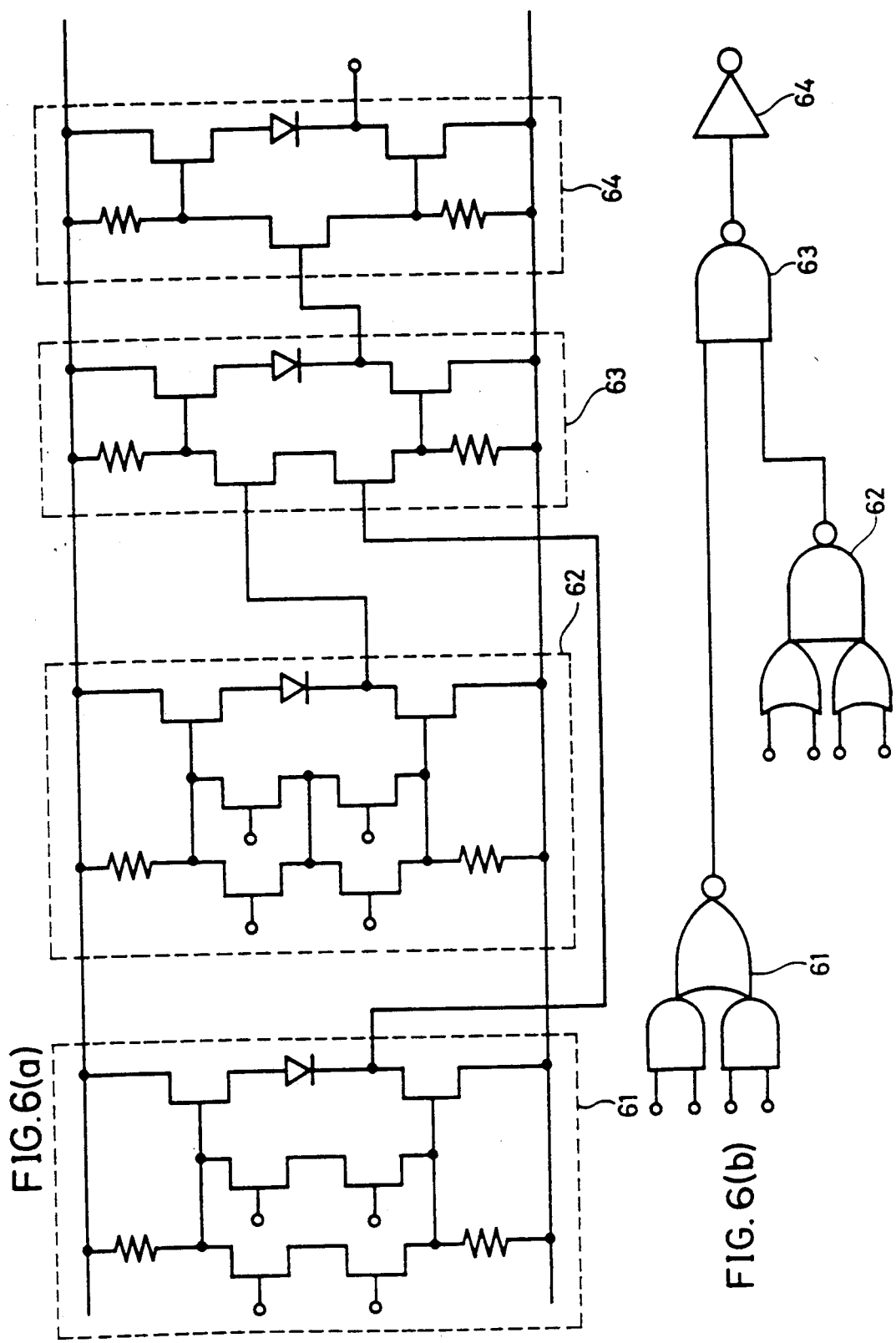
FIG. 6 (a) is a circuit diagram showing a logic circuit according to a fifth embodiment of the present invention.

FIG. 6 (a) shows a logic circuit according to the fifth embodiment of the present invention. Referring to FIG. 6 (a), the logic circuit of this embodiment has output portion of logic circuit 61 (AND/NOR gate) of FIG. 4 (a) and logic circuit 62 (OR/NAND gate) of FIG. 5 (a) connected to an input of NOR gate 63, the output of which is connected to inverter 64. FIG. 6 (b) shows an equivalent circuit to the logic circuit of FIG. 6 (a).

FIG. 7 (a) shows a logic circuit according to the sixth embodiment of the present invention. Referring to FIG. 7 (a), the circuit of this embodiment has an output portion of AND/NOR gate 61 and OR/AND gate 62 is connected to an input of NAND gate 65, the output of which is connected to inverter 64. FIG. 7 (b) shows an equivalent circuit of the logic circuit of FIG. 7 (a). (Since the expansion of logic voltage swing enables an enlarged noise) margin, more complex circuits are realizable, enabling formation of the logic circuits of FIGS. 6 (a) and 7 (a).

Figure 8:
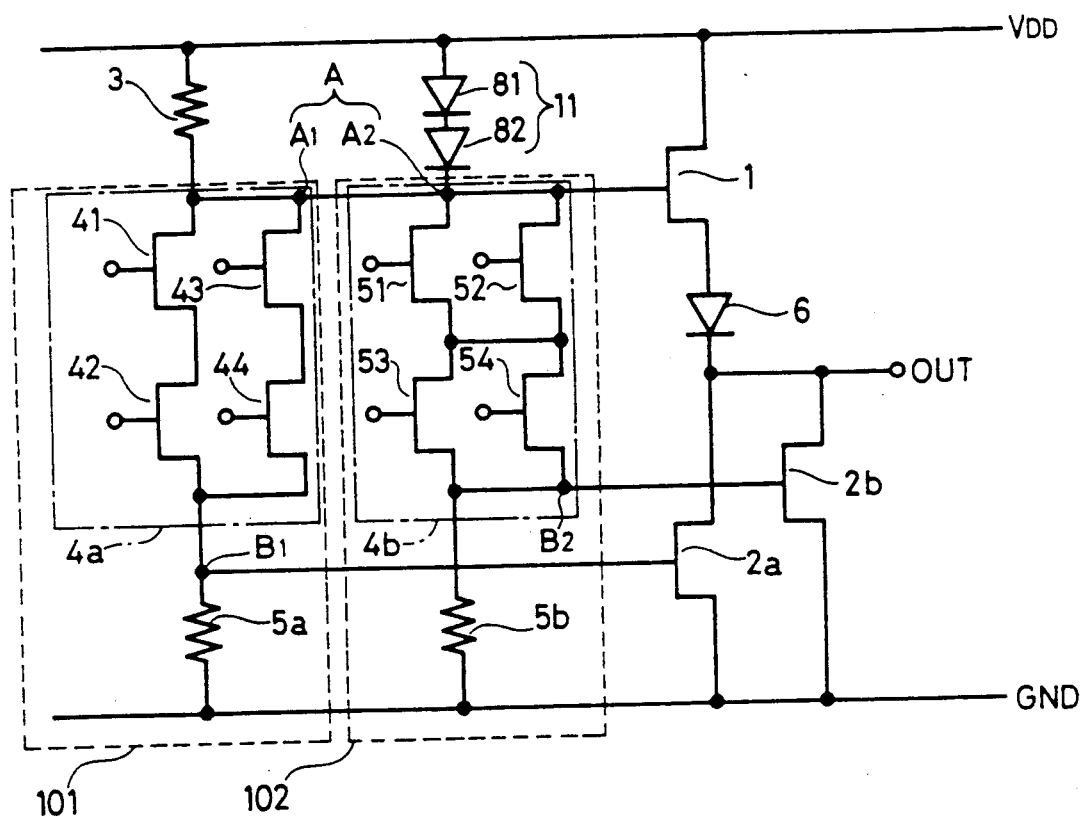
FIG. 8 is a circuit diagram showing a seventh embodiment of the present invention.

FIG. 8 shows a logic circuit according to the seventh embodiment of the present invention. The circuit of this embodiment is the improvement of the logic circuit of FIG. 6 (a) realized by taking a wired AND.

Referring to FIG. 8, logic circuit depicted comprises a load transistor controlling resistor 3 having one end connected to a first power suppl $V_{DD}$, and a voltage clamping circuit 11 including two stages of series-connected Schottky diodes 81 and 82 and connected in parallel to load transistor controlling resistor 3. A connecting portion "A" connects the other end of load transistor controlling resistor 3 and voltage clamping circuit 11. Drive transistor control resistors 5a and 5b each have one end connected to GND. An input portion 4a is connected between the connecting portion A and drive transistor control resistor 5i. Input portion 4b connected between load transistor controlling resistor 3 and drive transistor controlling resistor 5b. A load transistor 1 has its drain connected to $V_{DD}$ and its gate connected to the connecting portion A. level shifting means includes a Schottky diode 6 having a cathode connected to a source of load transistor 1 and an anode used as an output terminal (OUT)Drive transistor 2a has gate connected to a connecting portion B1 of drive transistor controlling resistor 5a and input portion 4a, a drain connected to the output terminal and a source connected to GND. Drive transistor 2b is connected in parallel to drive transistor 2a and has a gate connected to a connecting portion B2 of drive transistor controlling resistor 5b and input portion 4b.

A part of the above described logic circuit including the connecting portion A, input portion 4a, drive transistor controlling resistor 5a and connecting portion B1 is designated as an input logic portion 101. A part including the connecting portion A, input portion 4b, drive transistor controlling resistor 5b and connecting portion B2 is designated as an input logic portion 102. The connecting portion A includes input inversion portions A1 and A2 since an input level is inverted therein. The connecting portions B1 and B2 are input non-inversion portions.

The operation of the circuit of FIG. 8 will now be described. The input inversion portion A1 of input logic portion 101 is provided with an AND/NOR logic of input, while the input non-inversion portion B1 is provided with an AND/OR logic of input. Similarly, the input inversion portion A2 of input logic portion 102 is provided with an OR/NAND logic of input, while the input non-inversion portion B2 is provided with an OR/AND logic of input.

The respective input inversion portions A1 and A2 of input logic portions 101 and 102 are connected in common, and the AND of input inversion portions A1 and A2 is supplied to the gate of load transistor 1. Thus, the AND of the input inversion portions is supplied from the source of load transistor 1 through level shift diode 6 to be obtained from the output terminal OUT. Further, the OR of the input non-inversion portions B1 and B2 is produced by drive transistors 2a and 2b, and hence this circuit can perform a quasi-complementary operation.

A further description will be given with respect to this point. The quasi-complementary logic circuit performs its operation by supplying control signals of opposite logics to load transistor 1 and to drive transistors 2a and 2b (e.g., when load transistor 1 is supplied with a signal for turning on load transistor 1, drive transistors 2a and 2b are supplied with a signal for turning off these drive transistors). When the input inversion portions A1 and A2 of input logic portions 101 and 102 are both at a high level, (ii) the gate of load transistor 1 is supplied with an ON signal, while (ii) drive transistors 2a and 2b are supplied with an OFF signal since the input non-inversion portions B1 and B2 are both at low level. Accordingly, the logic circuit carries out the quasi-complementary operation. The output OUT attains high level at this time. Meanwhile, if one of the input inversion portions A1 and A2 of input logic portions 101 and 102 is at low level, (i) the gate of load transistor 1 is supplied with an OFF signal, while (ii) either drive transistor 2a or 2b is supplied with an ON signal since at least one of the input non-inversion portions B1 and B2 of input logic portions 101 and 102 attains the high level. Accordingly, the logic circuit carries out the quasi-complementary operation. The output signal supplied at OUT attains low level at this time. As described above, this logic circuit outputs the AND of input logic portions 101 and 102, so as to maintain the quasi-complementary operation.

Clamp diodes 81 and 82 clamp a gate potential of load transistor 1 so that the gate potential is not excessively lowered when the input inversion portions A1 and A2 of input logic portions 101 and 102 are both at low level.

As described above, the present invention makes it possible to fabricate a wired AND in the quasi-complementary logic circuit. Thus, the NAND gate as shown in FIG. 6 (a) need is not required and the delay time of one NAND gate stage is eliminated. Further, the reduction in the number of gates, power consumption and area thereby enhances integration density.

Figure 9:
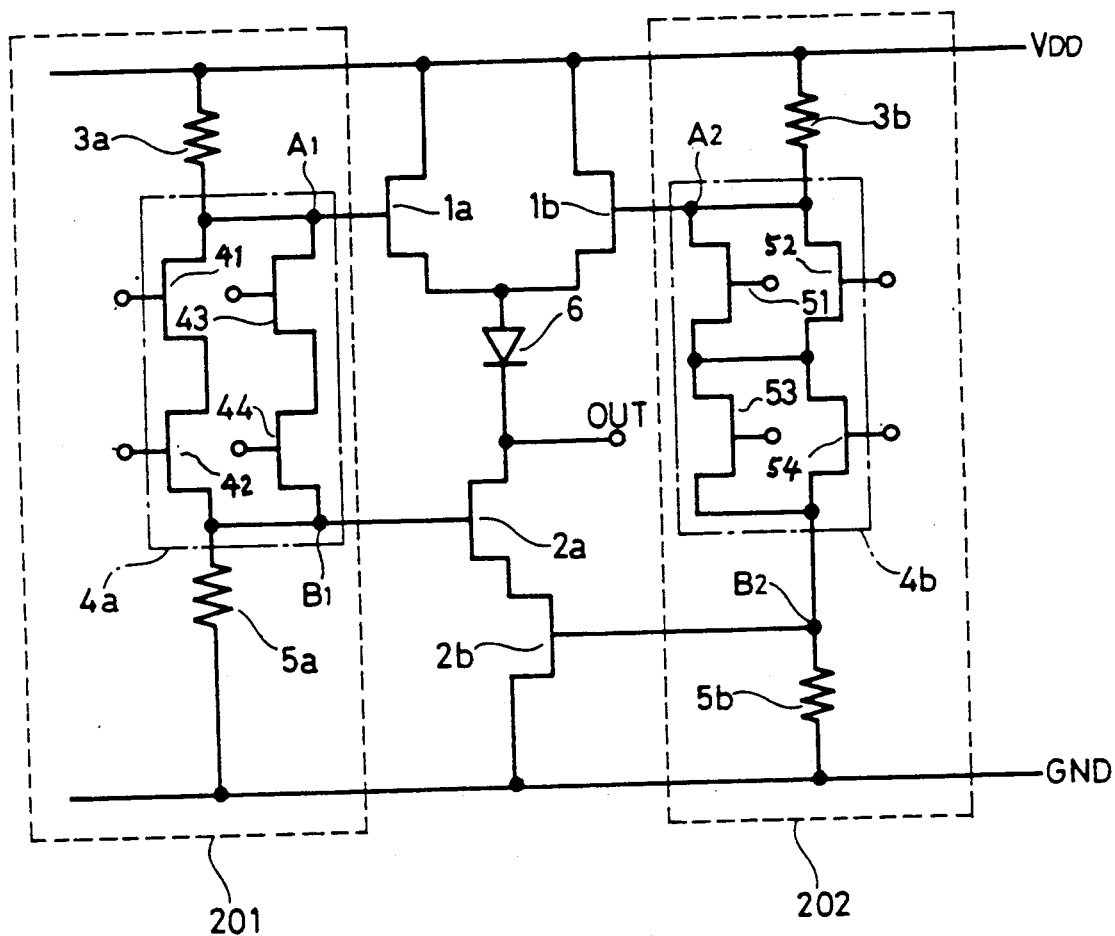
FIG. 9 is a circuit diagram showing an eighth embodiment of the present invention.

FIG. 9 shows a logic circuit according to an eighth embodiment of the present invention. The logic circuit of this embodiment is an improvement of the logic circuit of FIG. 7 (a), achieved by taking a wired OR. Referring to FIG. 9, the logic circuit comprises load transistor controlling resistors 3a and 3b each having one end connected to $V_{DD}$. Drive transistor controlling resistors 5a and 5b each have one end connected to GND. Input logic portion 201 has an input portion 4a connected between load transistor controlling resistor 3a and drive transistor controlling resistor 5a. An input inversion portion A1 connects load transistor controlling resistor 3a and input portion 4a. Input non-inversion portion B1 connects drive transistor controlling resistor 5a and input portion 4a. An input logic portion 202 has load transistor controlling resistor 3b, drive transistor controlling resistor 5b and an input portion 4b. Input inversion portion A2 connects load transistor controlling resistor 3b and input portion 4b. Input non-inversion portion B2 connects drive transistor controlling resistor 5b and input portion 4b. Loads transistor 1a has a drain connected to $V_{DD}$ and a gate connected to input inversion portion A1. Load transistor 1b is connected in parallel to transistor 1a and has a gate connected to input inversion portion A5 Schottky diode 6 includes a cathode connected to a common node of respective sources of load transistors 1a and 1b and an anode connected to an output terminal. Drive transistors 2a and 2b are connected in series between the output and GND, each having a gate connected respectively to input non-inversion portions B1 and B2. Upper drive transistor 2a has its drain connected to the output terminal, while lower drive transistor 2b has its source connected to GND.

The operation of the circuit of FIG. 9 will now be described. The input inversion portion A1 of input logic portion 201 is provided with an AND/NOR logic of input, while the input non-inversion portion B1 is provided with an AND/OR logic of input. Similarly, the input inversion portion A2 of input logic portion 202 is provided with an OR/NAND logic of input, while the input non-inversion portion B2 is provided with an OR/AND logic of input. The input inversion portions A1 and A2 of input logic portions 201 and 202 are provided to the gates of load transistors 1a and 1b, respectively. The sources of load transistors 1a and 1b are connected in common, so that the OR of input inversion portions A1 and A2 is supplied from the sources of load transistors 1a and 1b through a level shift diode 6 to be obtained at the output terminal OUT. Further, since the AND of input non-inversion portions B1 and B2 is produced by drive transistors 2a and 2b, this circuit can perform the quasi-complementary operation.

If the input inversion portions A1 and A2 of input logic portions 201 and 202 are both at low level, both load transistors 1a and 1b are supplied with an OFF signal, while the respective gates of drive transistors 2a and 2b are supplied with an ON signal since the input non-inversion portions B1 and B2 of input logic portions 201 and 202 are both at high level. The drive transistors 2a and 2b connected in series are thus rendered conductive. The output OUT is at low level at this time. Conversion, if at least one of the input inversion portions A1 and A2 of input logic portions 201 and 202 is at high level, at least one of load transistors 1a and 1b is supplied with an ON signal, while either drive transistor 2a or 2b is supplied with an OFF signal since at least one of the input non-inversion portions B1 and B2 attains low level. A high level signal is obtained from the output terminal OUT. As described above, this logic circuit outputs the OR of input logic portions 201 and 202, so as to preform the quasi-complementary operation.

As has been described in the foregoing, the present invention makes it possible to take a wired OR in the quasi-complementary logic circuit. Thus, such NOR gates as shown in the conventional example need no longer be added, and delay time by one NOR gate stage can be reduced. Further, since the number of gates can be reduced, the reduced power consumption and the reduced area can be accomplished, thereby increasing integration density.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A logic circuit for performing a quasi-complementary operation, comprising:
   a load transistor having a drain connected to a first power supply;
   a drive transistor having a source connected to a second power supply;
   level shift means connected between a source of said load transistor and a drain of said drive transistor;
   first resistor means connected between a gate of said load transistor and said first power supply;
   an input terminal;
   input means responsive to an input signal from said input terminal for applying signals for complementarily turning on/off said load transistor and said drive transistor to the respective gates of said load transistor and said drive transistor;
   an output portion provided at the drain of said drive transistor; and
   second resistor means connected between the gate of said drive transistor and said second power supply.

2. The logic circuit in accordance with claim 1, wherein
   said logic circuit is formed on a GaAs substrate.

3. The logic circuit in accordance with claim 1, wherein
   said drive transistor and load transistor input means comprises an MESFET (Metal Semiconductor Junction Field Effect Transistor).

4. The logic circuit in accordance with claim 1, wherein
   said first resistor means and said second resistor means each comprise a resistor or a depletion type transistor.

5. The logic circuit in accordance with claim 1, wherein
   said input means comprises an AND circuit including a plurality of MESFETs connected in series, an OR circuit including a plurality of MESFETs connected in parallel, or a circuit combining said AND circuit and said OR circuit.

6. The logic circuit in accordance with claim 1, wherein
   a plurality of said logic circuits are formed on the same substrate, said plurality of logic circuits being mutually logical-coupled.

7. The logic circuit in accordance with claim 6, wherein
   said plurality of logic circuits are logical-coupled by a wired logic.

8. A logic circuit for performing a quasi-complementary operation, comprising:
   resistor means connected to a first power supply;
   voltage clamping means connected in parallel to said resistor means;
   a load transistor having a gate connected to a connecting portion of said resistor means and said voltage clamping means and having a drain connected to said first power supply;
   level shift means having one end connected to a source of said load transistor and the other end used as an output terminal;
   a plurality of drive transistors having respective drains connected to the output terminal and respective sources connected to a second power supply; and
   a plurality of input logic portions each having input inversion portions and input non-inversion portions for outputting complementary signals in response to input signals, the input inversion portions being connected in common to the gate of said load transistor, the input non-inversion portions being connected to the respective gates of said drive transistors.

9. A logic circuit for performing a quasi-complementary operation, comprising:
   a plurality of load transistors having respective drains connected to a first power supply and respective sources mutually connected in common;
   level shift means having one end connected to the common connection portion of the sources of said load transistors and having the other end used as an output terminal;
   a plurality of drive transistors connected in series between said output terminal and a second power supply; and
   a plurality of input logic portions each having input inversion portions and input non-inversion portions for outputting complementary signals in response to input signals, the input inversion portions being connected to respective gates of said load transistors, the input non-inversion portions being connected in common to respective gates of said drive transistors; said logic circuit being characterized in that
   out of said drive transistors connected in series, a drain of the upper drive transistors is connected to the output terminal.

10. The logic circuit in accordance with claim 6, wherein
    said input means comprise resistor means connected to the second power supply and a plurality of Metal Semiconductor Junction Field Effect Transistors (MESFETs) connected in parallel or in series between said resistor means connected to the second power supply and said resistor means connected to the first power supply.

11. A logic circuit for performing a quasi-complementary operation, comprising:
    a load transistor having a drain connected to a source of a potential;
    a drive transistor having a source connected to a source of a second potential;
    level shifting means connected between a source of said load transistor and a drain of said drive transistor;
    first resistor means connected between a gate of said load transistor and said source of said first potential;
    an input terminal;
    input means responsive to an input signal from said input terminal for applying complementary signals to respective gates of said load and drive transistors;
    an output portion provided at the drain of said drive transistor; and
    second resistor means connected between the gate of said drive transistor and said source of said second potential.

12. A logic current for performing a quasi-complementary operation, comprising:
a load transistor having a drain connected to a source of a first potential;
a drive transistor having a source connected to a source of a second potential;
first resistor means connected between a gate of said load transistor and said source of said first potential;
an input terminal;
input means responsive to an input signal from said input terminal for applying complementary signals to respective gates of said load and drive transistors;
an output portion provided at the drain of said drive transistor; and
second resistor means connected between the gate of said drive transistor and said source of said second potential.

13. A logic circuit, comprising:
a load transistor connected between a first potential mode and a connecting node;
potential level shifting means connected between said connecting node and an output node;
a drive transistor connected between said output node and a second potential node;
first resistor means connected between a gate of said load transistor and said first potential node;
second resistor means connected between a gate of said drive transistor and said second potential node; and
input means having an input node and first and second nodes, said input node of said input means receiving an input signal, said first node thereof connected to a gate of said load transistor, and said second node thereof connected to a gate of said drive transistor.

14. A logic circuit comprising:
first and second field effect transistors connected in series with each other between first and second potential nodes;
an output terminal at a node between said first and second transistors;
an input terminal; and
input circuit means responsive to an input signal applied to said input terminal for supplying complementary driving signals to said first and second field effect transistors, said input circuit means including means responsive (1) to an input signal having a first logic state for turning said first transistor on and said second transistor off to provide at said output terminal a first output voltage level, and (2) to an input signal having a second logic state different from said first logic state for turning said first transistor fully off and said second transistor substantially off to provide at said output terminal a second output voltage level different from said first output level.

* * * * *